United States Patent [19]
Cosentino

[11] Patent Number: 5,225,365
[45] Date of Patent: Jul. 6, 1993

[54] METHOD OF MAKING A SUBSTANTIALLY PLANAR SEMICONDUCTOR SURFACE

[75] Inventor: Stephen J. Cosentino, Gilbert, Ariz.

[73] Assignee: Motorola, Inc., Schaumburg, Ill.

[21] Appl. No.: 860,374

[22] Filed: Mar. 30, 1992

[51] Int. Cl.⁵ ............................................. H01L 21/70
[52] U.S. Cl. ........................................ 437/57; 437/69; 437/33; 437/77; 437/26; 148/DIG. 9; 148/DIG. 116
[58] Field of Search ................ 437/28, 69, 57, 77, 437/33, 26; 198/DIG. 9, DIG. 10, DIG. 116

[56] References Cited

U.S. PATENT DOCUMENTS

| | | | |
|---|---|---|---|
| 4,694,562 | 12/1987 | Iwasaki et al. | 437/33 |
| 5,013,671 | 5/1991 | Havemann | 437/28 |
| 5,075,241 | 12/1991 | Spratt et al. | 437/57 |
| 5,079,177 | 1/1992 | Lage et al. | 148/DIG. 9 |
| 5,091,322 | 2/1992 | Maeda et al. | 148/DIG. 9 |
| 5,102,811 | 4/1992 | Scott | 437/57 |

FOREIGN PATENT DOCUMENTS 0248988 12/1987 European Pat. Off. ............ 437/57

Primary Examiner—Brian E. Hearn
Assistant Examiner—Trung Dang
Attorney, Agent, or Firm—Miriam Jackson

[57] ABSTRACT

A substantially planar semiconductor surface is formed for fabricating submicron BiCMOS integrated circuits. A lightly doped epitaxial layer is formed on a semiconductor substrate having buried layers formed therein. The substantially planar semiconductor surface is formed by forming a p-type well in the lightly doped epitaxial layer before the step of forming an n-type well in the lightly doped epitaxial layer.

22 Claims, 3 Drawing Sheets

METHOD OF MAKING A SUBSTANTIALLY PLANAR SEMICONDUCTOR SURFACE

BACKGROUND OF THE INVENTION

This invention relates, in general to semiconductor devices, including, but not limited, to a method of making a substantially planar semiconductor surface for semiconductor devices.

Bipolar and complimentary MOS (BiCMOS) devices are fabricated in a semiconductor structure which is comprised of a semiconductor substrate, having P-type and N-type buried layers formed in the substrate and an epitaxial layer formed on the substrate. An n-type well is formed in the epitaxial layer, followed by the formation of a p-type well. In the process of forming the buried layers and the wells, a differential step height is formed at the surface of the epitaxial layer between the N-type well and the P-type well (i.e. twin wells). This differential step height can cause depth of focus problems in the photolithographic steps. This had not been a major problem in devices with feature sizes greater than approximately a micron, however, it is a major problem in devices with submicron feature sizes. Depth of focus problems during processing ultimately can result in poor electrical characteristics and reduced yield in the submicron BiCMOS device.

In addition to the depth of focus problem, the differential step height in the semiconductor surface results in contact etching problems for deep submicron technologies. In general, it is desirable to planarize the device structure prior to deposition of a metal layer in order to facilitate patterning of submicron metal features. This planarization is accomplished by using planarizing dielectrics. When planarizing dielectrics are used on a structure having a differential step height in the semiconductor surface, along with the normal step height differentials in different areas of the device structure, it is difficult to remove portions of the planarizing dielectric to make contact to an underlying layer without removing a certain amount of that underlying layer in the areas where the planarizing dielectric layer is the thinnest. A way to solve this problem would be not to use planarizing dielectrics. This solution is not acceptable because it is undesirable to have non planar devices for deep submicron technologies.

Accordingly, it would be desirable to eliminate the differential step height created in the epitaxial layer to eliminate the depth of focus problem and the contact etching problem in submicron BiCMOS devices. In general, it would be desirable to eliminate the step height differential without unduly complicating the BiCMOS process.

SUMMARY OF THE INVENTION

A method of making a semiconductor device, comprising the steps of providing a p-type semiconductor substrate, forming a first n-type doped region in a portion of the p-type semiconductor substrate, forming a first p-type doped region in a portion of the p-type semiconductor substrate adjacent the first n-type doped region, forming a lightly doped epitaxial layer on the p-type semiconductor substrate, forming a second p-type doped region in the lightly doped epitaxial layer above the first p-type doped region, and forming a second n-type doped region in the lightly doped epitaxial layer above the first n-type doped region after the step of forming the second p-type doped region.

DETAILED DESCRIPTION OF THE DRAWINGS

Figure 1:
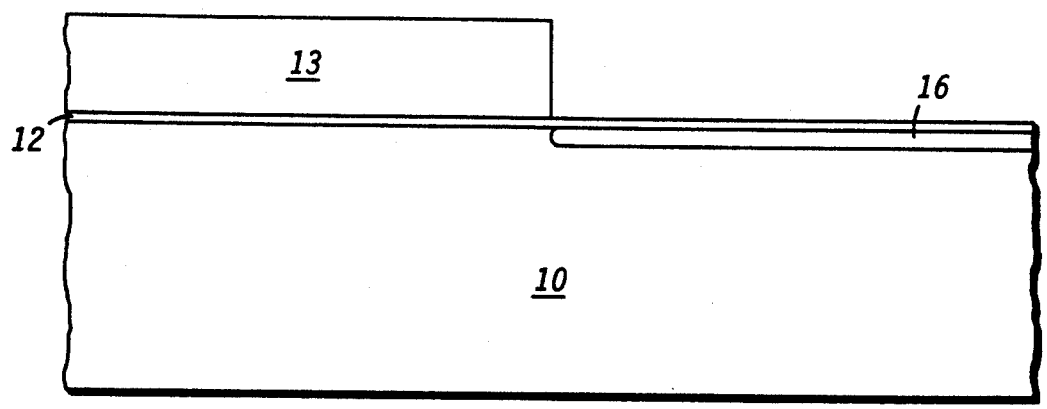
FIG. 1 illustrates an enlarged, cross-sectional view of an embodiment of the present invention in a beginning stage of fabrication.

FIG. 1 illustrates an enlarged, cross-sectional view of an embodiment of the present invention in a beginning stage of fabrication. What is shown is a p-type semiconductor substrate 10 preferably comprised of silicon. An insulating layer, here a silicon dioxide layer 12, is formed on substrate 10 and a patterned masking layer 13 is formed on silicon dioxide layer 12. Masking layer 13 is preferably comprised of a photoresist layer. A first n-type doped region 16 is formed in a portion of p-type semiconductor dopant. Arsenic is preferably used, however, other suitable dopants may be used. The peak doping concentration of first doped region 16 is preferably approximately $5 \times 10^{19}$ atoms/cm$^3$. First n-type doped region 16 acts as an n-type buried layer.

Figure 2:
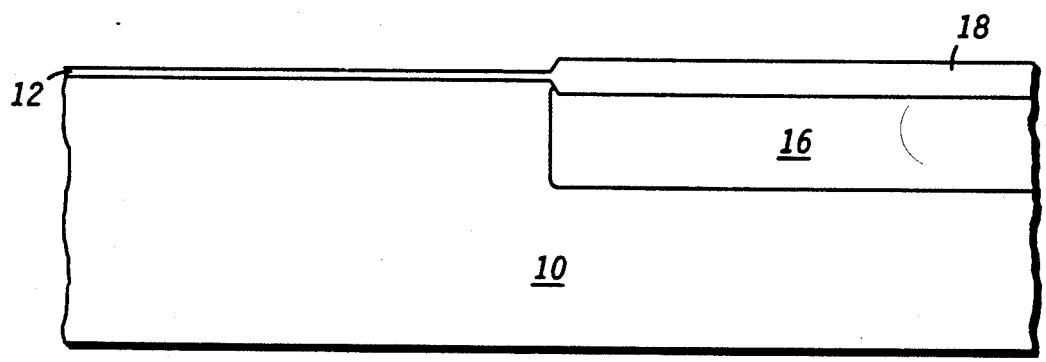
FIG. 2 illustrates an enlarged, cross-sectional view of an embodiment of the present invention in a further stage of fabrication.

FIG. 2 illustrates the structure of FIG. 1 further along in processing. First, masking layer 13 is removed. Then an oxidation step is performed. As is well known in the art, there is a differential oxide growth rate between a heavily doped region and an undoped region of a semiconductor layer. This creates a step differential on the surface of p-type semiconductor substrate 10. In order to simplify the drawing, a silicon dioxide layer 18 is only shown to be formed over first n-type doped region 16. Silicon dioxide layer 18 includes silicon dioxide layer 12, however, because the delineation between silicon dioxide layer 12 and 18 is not discernible, only silicon dioxide layer 18 is shown. In addition, a small amount of silicon dioxide grows on silicon dioxide layer 12, however, this is not shown for convenience. During the oxidation, first n-type doped region 16 is diffused further into substrate 10.

Figure 3:
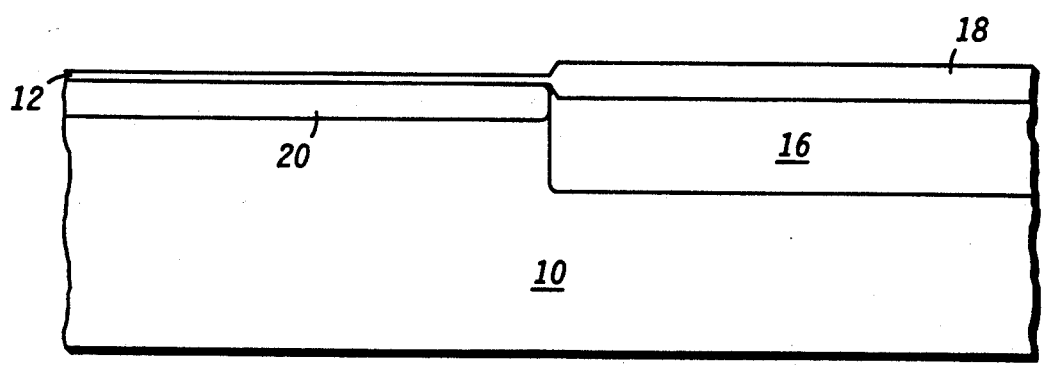
FIG. 3 illustrates an enlarged, cross-sectional view of an embodiment of the present invention in a further stage of fabrication.

FIG. 3 illustrates the structure of FIG. 2 further along in processing. A first p-type doped region 20 is formed in a portion of p-type semiconductor substrate 10 adjacent to first n-type doped region 16, preferably by ion implantation of a p-type dopant. Boron is preferably used, however, other suitable dopants may be used. The peak doping concentration of first p-type doped region 20 is preferably approximately $1 \times 10^{17}$ atoms/cm$^3$. In this step, silicon dioxide layer 18 prevents the penetration of dopants there through. First p-type doped region 20 acts as a p-type buried layer. First n-type doped region 16 must be formed before first p-type doped region 20 because the p-type dopant level of first p-type doped region 20 is not high enough to create a silicon dioxide layer 18 thick enough to prevent the penetration of dopants there through.

Figure 4:
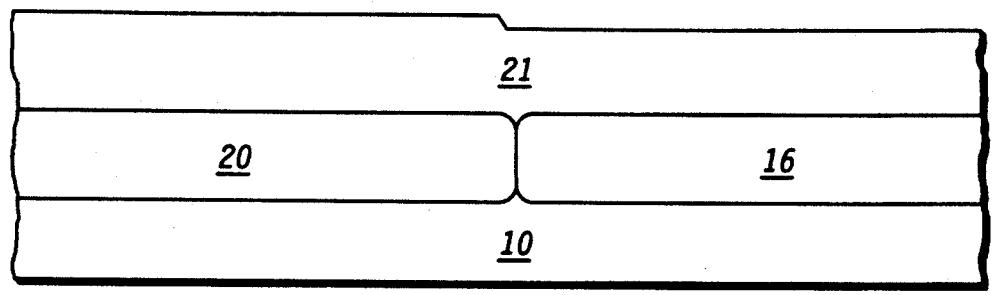
FIG. 4 illustrates an enlarged, cross-sectional view of an embodiment of the present invention in a further stage of fabrication.

FIG. 4 illustrates the structure of FIG. 3 further along in processing. First, silicon dioxide layers 12 and 8 are removed. A lightly doped epitaxial layer 21 preferably comprised of silicon is then formed over p-type semiconductor substrate 10. Lightly doped epitaxial layer may be either p-type or n-type, but preferably p-type. In the present invention, lightly doped means less than approximately $1 \times 10^{15}$ atoms/cm$^3$. During this process, first p-type doped region 20 is diffused further into p-type semiconductor substrate 10. The step differential present in p-type semiconductor substrate 10 is carried through to lightly doped epitaxial layer 21. The thickness of lightly doped epitaxial layer 21 is preferably in the range of approximately 1.3 to 1.6 micrometers because it is desirable to have the bipolar transistors formed in a second n-type doped region 32 (shown in FIG. 8 and described below) close to first n-type doped region 16 to improve the performance of the bipolar transistors. In the past, a thicker epitaxial layer was used because the oxidation steps reduced the thickness of the epitaxial layer in the region where the bipolar transistors are fabricated.

Figure 5:
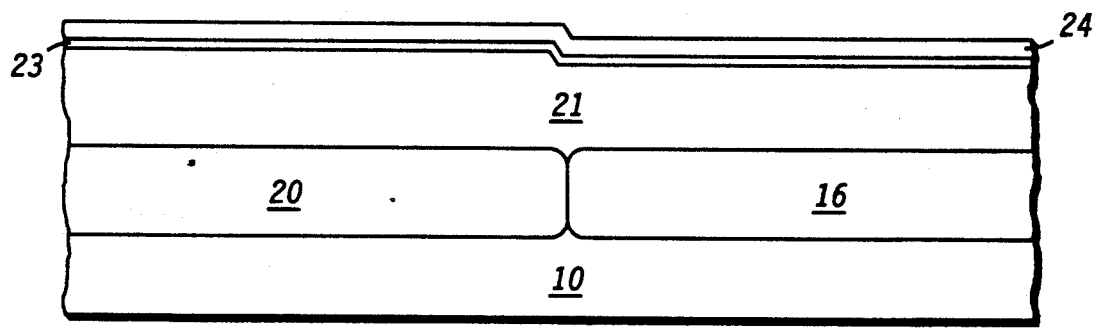
FIG. 5 illustrates an enlarged, cross-sectional view of an embodiment of the present invention in a further stage of fabrication.

FIG. 5 illustrates the structure of FIG. 4 further along in processing. A silicon dioxide layer 23 is then formed on the surface of lightly doped epitaxial layer 21. Subsequently, a non-oxidizing layer 24 is formed on silicon dioxide layer 23. In a preferred embodiment, the non-oxidizing layer 24 is comprised of silicon nitride.

Figure 6:
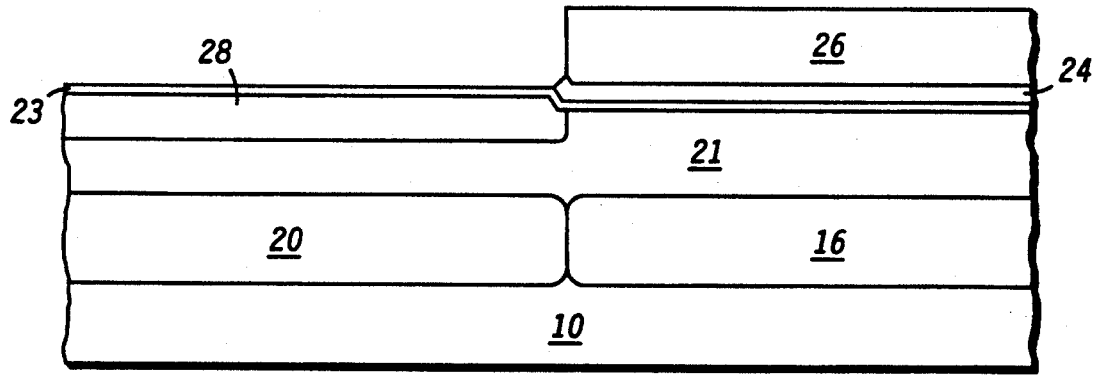
FIG. 6 illustrates an enlarged, cross-sectional view of an embodiment of the present invention in a further stage of fabrication.

FIG. 6 illustrates the structure of FIG. 5 further along in processing. A masking layer 26 is formed and patterned on silicon nitride layer 24 such that masking layer 26 is only disposed on silicon nitride layer 24 over first n-type doped region 16. Masking layer 26 is preferably comprised of a photoresist layer. Thereafter, the portion of silicon nitride layer 24 not covered by masking layer 26 is removed. Subsequently, a second p-type doped region 28 is formed in a portion of lightly doped epitaxial layer 21 over first p-type doped region 20. Second p-type doped region 28 is preferably formed by ion implantation of a p-type dopant. Boron is preferably used, however, other suitable dopants may be used. Second p-type doped region 28 acts as a p-type well. The doping concentration of second p-type doped region 28 is preferably in the range of approximately $5 \times 10^{16}$ to $1 \times 10^{17}$ atoms/cm$^3$. This range provides for good electrical characteristics of the CMOS transistors with a thin gate silicon dioxide and submicron feature sizes. In the past, it was desirable to have the CMOS transistors formed in second p-type doped region 28 far from first p-type doped region 20 to reduce the body effect and have low source/drain junction capacitance. In the present invention, there is little difference between the doping of first p-type doped region 20 and second p-type doped region 28, so second p-type doped region 28 may be close to first p-type doped region 20 without resulting in CMOS transistors having high source/drain junction capacitance or a large body effect.

Figure 7:
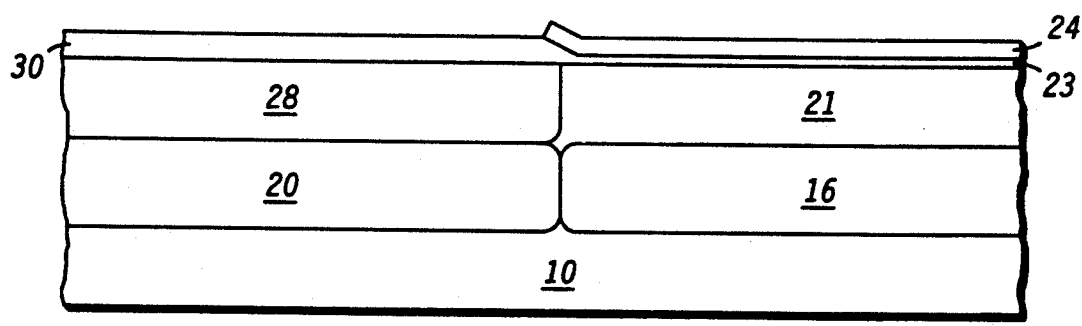
FIG. 7 illustrates an enlarged, cross-sectional view of an embodiment of the present invention in a further stage of fabrication.

FIG. 7 illustrates the structure of FIG. 6 further along in processing. Masking layer 26 is removed and then an oxidation step is performed. Non-oxidizing layer 24 is, of course, not oxidized during this process so a silicon dioxide layer 30 is only formed on lightly doped epitaxial layer 21 over second p-type doped region 28. During this step, second p-type doped region 28 is further diffused into lightly doped epitaxial layer 21. Silicon dioxide layer 30 includes silicon dioxide layer 23, however, because the delineation between silicon dioxide layer 23 and 30 is not discernible, only silicon dioxide layer 30 is shown. Note that after this oxidation the step height differential in lightly doped epitaxial layer 21 is substantially removed thus forming a substantially planar semiconductor surface.

Figure 8:
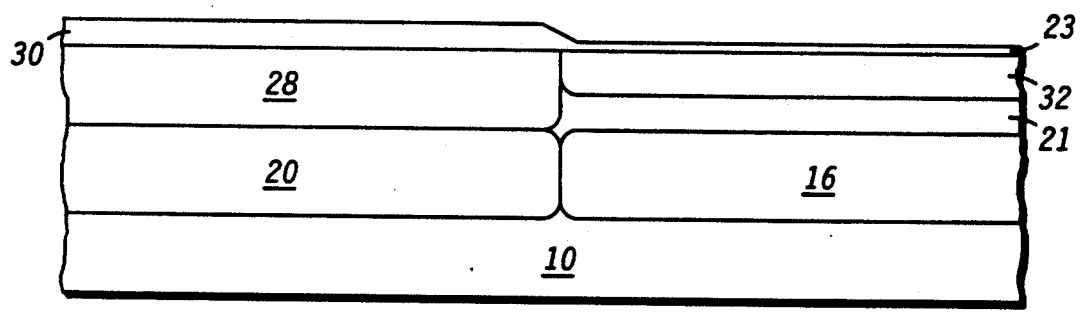
FIG. 8 illustrates an enlarged, cross-sectional view of an embodiment of the present invention in a further stage of fabrication.

FIG. 8 illustrates the structure of FIG. 7 further along in processing. Silicon nitride layer 24 is removed. A second n-type doped region 32 is formed in lightly doped epitaxial layer 21 adjacent second p-type doped region 28 and over first n-type doped region 16. Second n-type doped region 32 is preferably formed by ion implantation of an n-type dopant. Phosphorus is preferably used, however, other suitable dopants may be used. Second n-type doped region 32 acts as an n-type well. Second n-type doped region 32 must be formed after second p-type doped region 28. If n-type doped region 32 is formed before second p-type doped region 28, the differential step height present in lightly doped epitaxial layer 21 remains and gets larger, because further oxidation of lightly doped epitaxial layer 21 in the area where second n-type doped region 32 is formed would take place.

Figure 9:
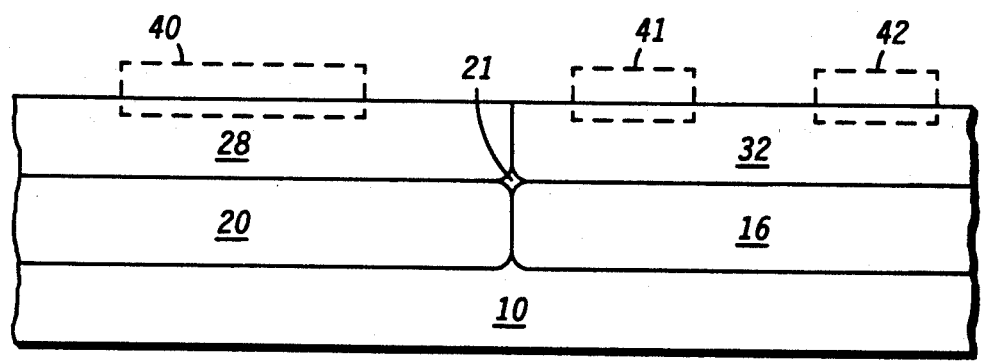
FIG. 9 illustrates an enlarged, cross-sectional view of an embodiment of the present invention in a further stage of fabrication.

FIG. 9 illustrates the structure of FIG. 8 further along in processing. An anneal is performed to further diffuse second n-type doped region 32 into lightly doped epitaxial layer 21. Silicon dioxide layers 23 and 30 are then removed. Many different ways to fabricate a submicron BiCMOS circuit, comprised of an NMOS device 40 formed in second p-type doped region 28, a PMOS device 41 and a bipolar device 42 formed in second n-type doped region 32 are well known, so these devices are represented by boxes in order to simplify the drawing.

As can be seen, a substantially planar semiconductor surface is formed by forming the p-type well before the n-type well is formed. A substantially planar semiconductor surface is necessary to successfully fabricate submicron BiCMOS devices. The substantially planar semiconductor surface eliminates depth of focus problems. In addition, problems in etching deep submicron contacts in planarizing dielectrics are reduced. Furthermore, only two masking layers (masking layers 13 and 26) are required in the present invention to form a substantially planar semiconductor surface. Other ways to fabricate a substantially planar semiconductor device which would require more masking layers are not desirable because of the added cost and complications to the process. The simplicity of the present invention is a major benefit of this method.

I claim:

1. A method of making a substantially planar semiconductor surface, comprising the steps of:
   providing a p-type semiconductor substrate;
   forming a first n-type doped region in a portion of the p-type semiconductor substrate;

forming a first p-type doped region in a portion of the p-type semiconductor substrate adjacent the first n-type doped region after the step of forming the first n-type doped region;

forming a lightly doped epitaxial layer on the p-type semiconductor substrate;

forming a non-oxidizing layer on the lightly doped epitaxial layer above the first n-type doped region;

forming a second p-type doped region in the lightly doped epitaxial layer above the first p-type doped region after the step of forming a non-oxidizing layer;

forming an insulating layer on the lightly doped epitaxial layer over the second p-type doped region; and forming a second n-type doped region in the lightly doped epitaxial layer above the first n-type doped region after the step of forming the second p-type doped region, wherein a substantially planar semiconductor surface of the lightly doped epitaxial layer is provided by forming the second n-type doped region after the step of forming the second p-type doped region.

2. The method of claim 1 wherein the step of forming a lightly doped epitaxial layer is comprised of forming a lightly doped epitaxial layer having a thickness of approximately 1.3 to 1.6 micrometers.

3. The method of claim 1 wherein the step of forming a second p-type doped region is comprised of forming a second p-type doped region having a doping concentration of $5 \times 10^{16}$ to $1 \times 10^{17}$ atoms/cm$^3$.

4. The method of claim 1 further comprising the steps of forming an NMOS device in the second p-type doped region and forming a PMOS device and a bipolar device in the second n-type doped region to form a BiCMOS integrated circuit.

5. A method of making a substantially planar semiconductor surface, comprising the steps of:

providing a p-type semiconductor substrate having a first n-type doped region formed in a portion of the p-type semiconductor substrate and a first p-type doped region formed in a portion of the p-type semiconductor substrate adjacent the first n-type doped region;

providing a lightly doped epitaxial layer on the p-type semiconductor substrate;

forming a non-oxidizing layer on the lightly doped epitaxial layer above the first n-type doped region;

forming a second p-type doped region in the lightly doped epitaxial layer above the first p-type doped region after the step of forming a non-oxidizing layer;

forming an insulating layer on the lightly doped epitaxial layer over the second p-type doped region; and forming a second p-type doped region in the lightly doped epitaxial layer above the first p-type doped region; and forming a second n-type doped region in the lightly doped epitaxial layer above the first n-type doped region after the step of forming the second p-type doped region, wherein a substantially planar semiconductor surface of the lightly doped epitaxial layer is provided by forming the second n-type doped region after the step of forming the second p-type doped region.

6. The method of claim 5 wherein the step of forming a lightly doped epitaxial layer is comprised of forming a lightly doped epitaxial layer having a thickness of approximately 1.3 to 1.6 micrometers.

7. The method of claim 5 wherein the step of forming a second p-type doped region is comprised of forming a second p-type doped region having a doping concentration of $5 \times 10^{16}$ to $1 \times 10^{17}$ atoms/cm$^3$.

8. The method of claim 5 further comprising the steps of forming an NMOS device in the second p-type doped region and forming a PMOS device and a bipolar device in the second n-type doped region to form a BiCMOS integrated circuit.

9. A method of making a BiCMOS integrated circuit having a substantially planar semiconductor surface, comprising the steps of:

providing a p-type semiconductor substrate;

forming an n-type buried layer in a portion of the p-type semiconductor substrate;

forming a p-type buried layer in a portion of the p-type semiconductor substrate adjacent the n-type buried layer after the step of forming the n-type buried layer;

forming a lightly doped epitaxial layer on the p-type semiconductor substrate;

forming a non-oxidizing layer on the lightly doped epitaxial layer above the n-type buried layer;

forming a p-type well in the lightly doped epitaxial layer above the p-type buried layer;

forming an insulating layer on the lightly doped epitaxial layer above the p-type well;

removing the non-oxidizing layer;

forming an n-type well in the lightly doped epitaxial layer above the n-type buried layer after the step of removing the non-oxidizing layer, wherein a substantially planar semiconductor surface of the lightly doped epitaxial layer is provided by forming the n-type well after forming the p-type well; and removing the insulating layer.

10. The method of claim 9 wherein the step of forming a lightly doped epitaxial layer is comprised of forming a lightly doped epitaxial layer having a thickness of approximately 1.3 to 1.6 micrometers.

11. The method of claim 9 wherein the step of forming a p-type well is comprised of forming a p-type well having a doping concentration of $5 \times 10^{16}$ to $1 \times 10^{17}$ atoms/cm$^3$.

12. The method of claim 9 further comprising the steps of forming an NMOS device in the p-type well and forming a PMOS device and a bipolar device in the n-type well to form a BiCMOS integrated circuit.

13. A method of making a submicron BiCMOS integrated circuit having a substantially planar semiconductor surface, comprising the steps of:

providing a p-type silicon substrate;

forming a photoresist masking layer on a portion of the p-type silicon substrate;

forming an n-type buried layer in a portion of the p-type silicon substrate where the photoresist masking layer is not formed;

removing the photoresist masking layer;

oxidizing the p-type silicon substrate to form a first silicon dioxide masking layer on the p-type silicon substrate over the n-type buried layer by utilizing a differential silicon dioxide growth rate between the n-type buried layer and the p-type silicon substrate;

forming a p-type burried layer in a portion of the p-type silicon substrate adjacent the n-type buried layer after the step of forming the n-type buried layer using the first silicon dioxide masking layer as a mask;

removing the first silicon dioxide masking layer as a mask;

removing the first silicon dioxide masking layer;

forming a lightly doped epitaxial silicon layer on the p-type silicon substrate;

forming a silicon nitride masking layer on the lightly doped epitaxial silicon layer above the n-type buried layer;

forming a second silicon dioxide layer on the lightly doped epitaxial silicon layer over the p-type well;

removing the silicon nitride masking layer;

forming an n-type well in the lightly doped epitaxial silicon layer above the n-type buried layer after the step of removing the silicon nitride masking layer, wherein a substantially planar semiconductor surface of the lightly doped epitaxial silicon layer is provided by forming the n-type well after forming the p-type well; and removing the silicon dioxide layer.

14. The method of claim 1 further comprising the steps of:

forming a photoresist masking layer on a portion of the p-type semiconductor substrate so that the first n-type doped region is formed in the portion of the p-type semiconductor substrate where the photoresist masking layer is not formed;

removing the photoresist masking layer after the step of forming the first n-type doped region;

oxidizing the p-type semiconductor substrate to form an oxide masking layer on the p-type semiconductor substrate over the first n-type doped region by utilizing a differential oxide growth rate between the first n-type doped region and the p-type semiconductor substrate and using the oxide masking layer as a mask when forming the first p-type doped region; and removing the oxide masking layer.

15. The method of claim 1 wherein the step of forming a first p-type doped region is comprised of forming the first p-type doped region having a doping concentration of approximately $1 \times 10^{17}$ atoms/cm$^3$ and wherein the step of forming the second p-type doped region is comprised of forming the second p-type doped region having a doping concentration approximately $5 \times 10^{16}$ to $1 \times 10^{17}$ atoms/cm$^3$ so that a CMOS device formed in the second p-type doped region has a low source/drain capacitance and a low body effect.

16. The method of claim 1 wherein the step of forming the insulating layer comprises oxidizing the lightly doped layer over the second p-type doped region to form the insulating layer so that the lightly doped layer is substantially planar and wherein the insulating layer act as a mask for forming the second n-type doped region.

17. The method of claim 5 further comprising the steps of:

forming a photoresist masking layer on a portion of the p-type semiconductor substrate so that the first n-type doped region is formed in the portion of the p-type semiconductor substrate where the photoresist masking layer is not formed;

removing the photoresist masking layer after the step of forming the first n-type doped region;

oxidizing the p-type semiconductor substrate to form an oxide masking layer on the p-type semiconductor substrate over the first n-type doped region by utilizing a differential oxide growth rate between the first n-type doped region and the p-type semiconductor substrate and using the oxide masking layer as a mask when forming the first p-type doped region; and removing the oxide masking layer.

18. The method of claim 5 wherein the step of forming a first p-type doped region is comprised of forming the first p-type doped region having a doping concentration of approximately $1 \times 10^{17}$ atoms/cm$^3$ and wherein the step of forming the second p-type doped region is comprised of forming the second p-type doped region having a doping concentration of approximately $5 \times 10^{16}$ to $1 \times 10^{17}$ atoms/cm$^3$ so that a CMOS source/drain capacitance and a low body effect.

19. The method of claim 5 wherein the step of forming the insulating layer comprises oxidizing the lightly doped layer over the second p-type doped region to form the insulating layer so that the lightly doped layer is substantially planar and wherein the insulating layer act as a mask for forming the second n-type doped region.

20. The method of claim 13 wherein the step of forming a lightly doped epitaxial layer is comprised of forming a lightly doped epitaxial layer having a thickness of approximately 1.3 to 1.6 micrometers.

21. The method of claim 13 wherein the step of forming a p-type well is comprised of forming a p-type well having a doping concentration of $5 \times 10^{16}$ to $1 \times 10^{17}$ atoms/cm$^3$.

22. The method of claim 13 further comprising the steps of forming an NMOS device in the p-type well and forming a PMOS device and a bipolar device in the n-type well to form a BiCMOS integrated circuit.

* * * * *